(12) United States Patent
Melde et al.

(10) Patent No.: US 9,842,845 B1
(45) Date of Patent: Dec. 12, 2017

(54) METHOD OF FORMING A SEMICONDUCTOR DEVICE STRUCTURE AND SEMICONDUCTOR DEVICE STRUCTURE

(71) Applicant: GLOBALFOUNDRIES Inc., Grand Cayman (KY)

(72) Inventors: Thomas Melde, Dresden (DE); Ralf Richter, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/337,441

(22) Filed: Oct. 28, 2016

(51) Int. Cl.
| | |
|---|---|
| H01L 29/788 | (2006.01) |
| H01L 29/792 | (2006.01) |
| H01L 21/8238 | (2006.01) |
| H01L 21/336 | (2006.01) |
| H01L 27/11531 | (2017.01) |
| H01L 27/11521 | (2017.01) |
| H01L 29/423 | (2006.01) |
| H01L 29/66 | (2006.01) |
| H01L 21/28 | (2006.01) |
| H01L 21/311 | (2006.01) |
| H01L 29/49 | (2006.01) |

(52) U.S. Cl.
CPC .. H01L 27/11531 (2013.01); H01L 21/28035 (2013.01); H01L 21/28273 (2013.01); H01L 21/31111 (2013.01); H01L 27/11521 (2013.01); H01L 29/42328 (2013.01); H01L 29/4916 (2013.01); H01L 29/66825 (2013.01); H01L 29/788 (2013.01)

(58) Field of Classification Search
CPC ......... H01L 27/11517; H01L 27/11526; H01L 27/11531; H01L 27/11534; H01L 27/11558; H01L 27/1156; H01L 29/42324; H01L 29/42328; H01L 29/788
USPC ........ 438/201, 211, 257, 266; 257/288, 315, 257/326, 368
See application file for complete search history.

(56) References Cited

U.S. PATENT DOCUMENTS 7,355,240 B2 * 4/2008 Tu ..................... H01L 21/28273
257/315
9,634,017 B1 * 4/2017 Baars ................ H01L 27/11521

* cited by examiner

Primary Examiner — Hsien Ming Lee
(74) Attorney, Agent, or Firm — Amerson Law Firm, PLLC

(57) ABSTRACT

The present disclosure provides a semiconductor device structure including a non-volatile memory (NVM) device structure in and above a first region of a semiconductor substrate and a logic device formed in and above a second region of the semiconductor substrate different from the first region. The NVM device structure includes a floating-gate, a first select gate and at least one control gate. The logic device includes a logic gate disposed on the second region and source/drain regions provided in the second region adjacent to the logic gate. The control gate extends over the floating-gate and the first select gate is laterally separated from the floating-gate by an insulating material layer portion. Upon forming the semiconductor device structure, the floating gate is formed before forming the control gate and the logic device.

20 Claims, 8 Drawing Sheets

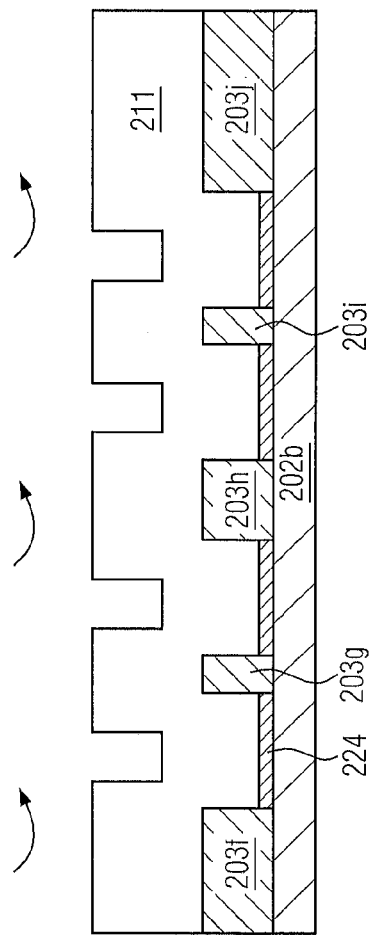
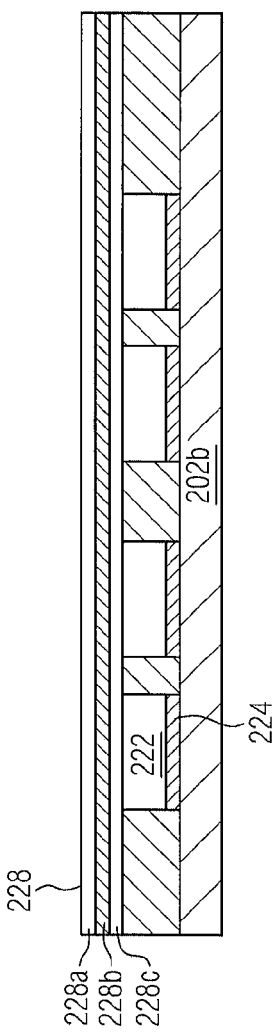
FIG. 3e
FIG. 3f

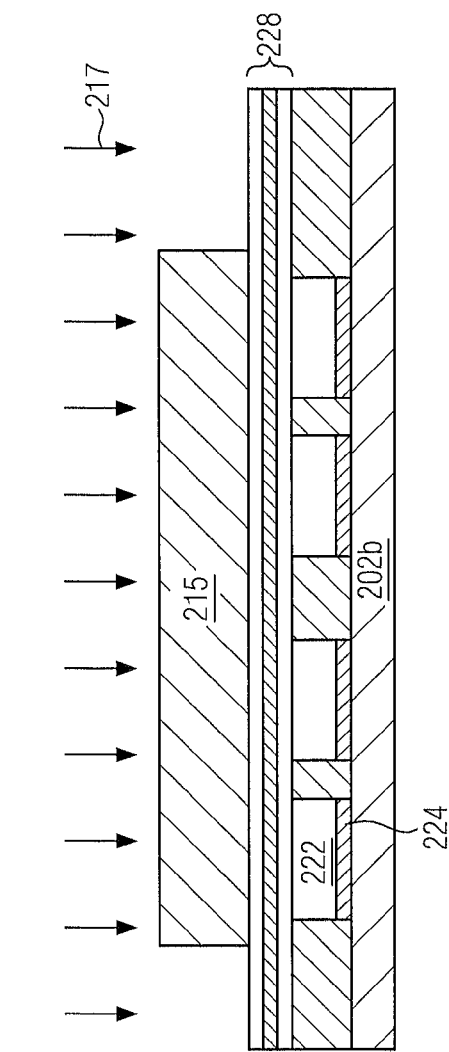
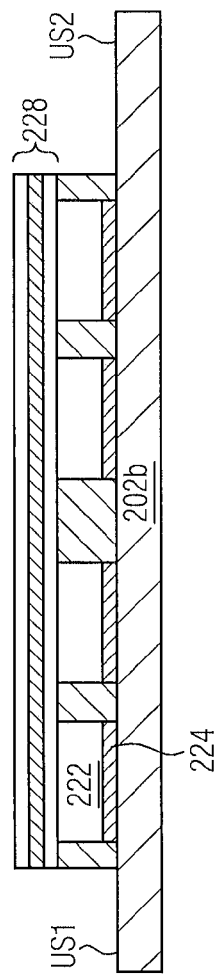
FIG. 3g
FIG. 3h

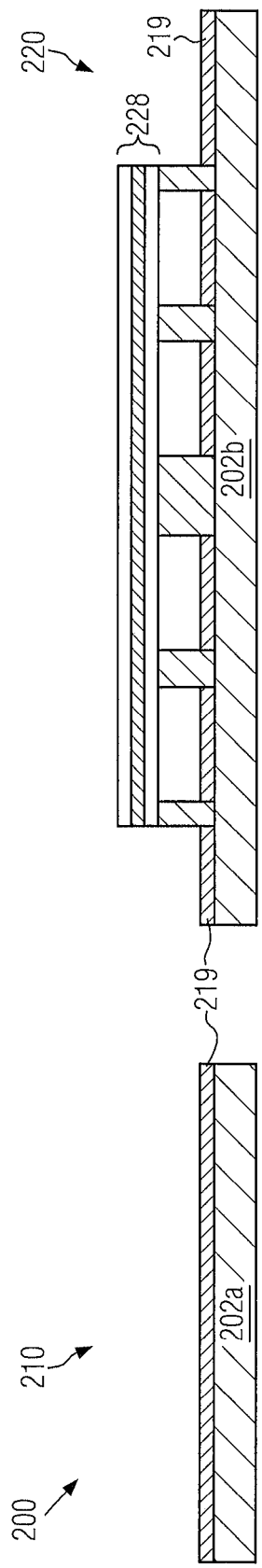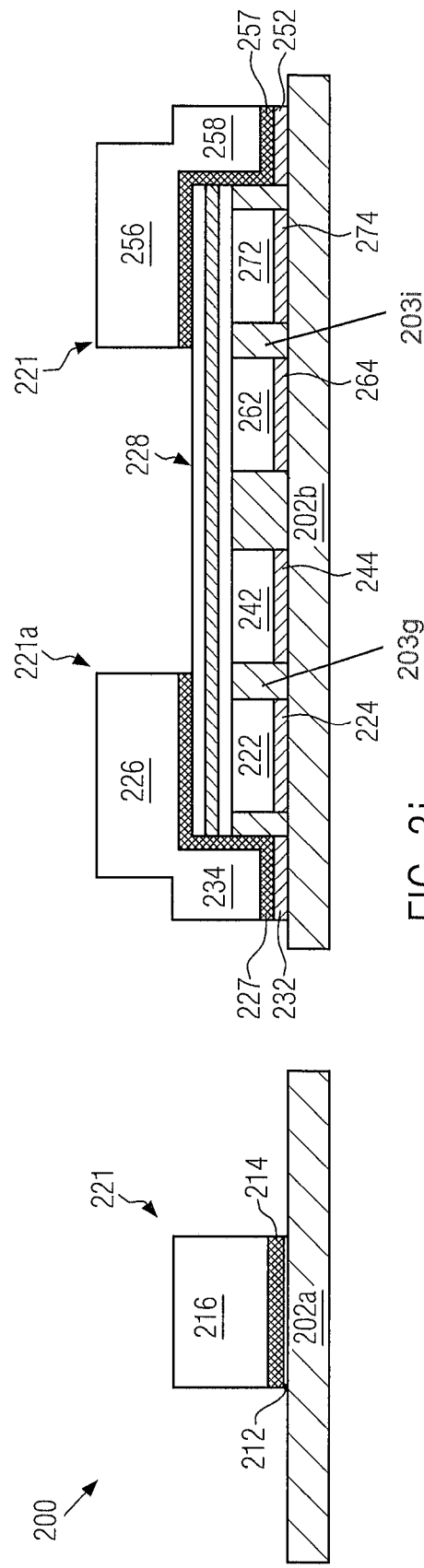

METHOD OF FORMING A SEMICONDUCTOR DEVICE STRUCTURE AND SEMICONDUCTOR DEVICE STRUCTURE

BACKGROUND OF THE INVENTION

1. Field of the Invention

The present disclosure relates to a method of forming a semiconductor device structure and to a semiconductor device structure. In particular, the present disclosure relates to a semiconductor device structure formed with a memory device structure having a non-volatile memory device and to a logic device co-integrated with the memory device at advanced technology nodes.

2. Description of the Related Art

At present, semiconductor storage technologies represent some of the most commonly used data storage technologies. In general, semiconductor memory makes use of semiconductor-based circuit elements, such as transistors or capacitors, to store information. Typically, common semiconductor chips typically contain millions of such circuit elements and development efforts continue aiming at increasing the integration density of circuit elements on a single chip.

Semiconductor memory exists in two basic forms: as volatile memory and non-volatile memory. In modern computers, primary storage almost exclusively consists of dynamic volatile semiconductor memory or dynamic random access memory (DRAM).

Since the turn of the century, a type of non-volatile semiconductor memory known as "flash memory" has steadily gained share as offline storage for home computers. Non-volatile semiconductor memory is also increasingly used for secondary storage in various advanced electronic devices and specialized computers.

The increasing demand for more mobility, higher integration density and lower power consumption constantly drives the development of complex electronic devices, e.g., microchips, to the limits of current fabrication techniques. Particularly, the increased need of mobility, which is, for instance, driven by developments such as the internet of things (IoT), drives an increasing interest in non-volatile memory devices. For example, the market of flash memory technologies rapidly increased from a share in the market of 11% in 1998 to more than 32% in 2006. At the same time, the share of DRAM technology in the market decreased from 61% to 56% and continues to shrink. The tendency is not expected to change because of the unchallenged performance advantages of non-volatile memories over current technologies, such as DRAM, with regard to write endurance, write voltage and power consumption.

As noted above, flash memory is a popular example of an electronic non-volatile computer storage medium that can be electrically erased and reprogrammed, storing information in an array of memory cells, e.g., made from floating-gate transistors. Herein, single-level cell (SLC) devices (each cell only stores one bit of information) and multi-level cell (MLC) devices, including triple-level cell (TLC) devices, (each cell may store more than one bit of information) may be readily realized in accordance with flash memory techniques. In most types of flash memory, a charge storing structure is provided by means of a conductive (typically polysilicon) layer (floating gate) or non-conductive (such as silicon nitride $Si_3N_4$ in SONOS devices) layer being embedded into the gate dielectric of a so-called "control gate." In particular, the floating-gate and the control gate are physically and electrically separated from each other: the floating-gate is electrically isolated by means of a gate dielectric interposed between the floating-gate and an underlying channel region, as well as by means of a dielectric interposed between the control gate and the floating-gate.

In flash memory, the threshold voltage characteristic of the transistor formed by the control gate and the charge storing structure (e.g., floating-gate or nitride layer in SONOS devices) upon supplying a certain voltage ("read voltage") is controlled by the amount of charge that is retained on the charge storing structure. Particularly, for a given level of charge on the charge storing structure, there is a corresponding voltage (threshold) that must be applied to the control gate before the transistor is turned "on", i.e., permitting an electric current flow between the source and drain regions of the transistor. SLC devices are implemented by only programming the floating-gates to a single threshold voltage level and to erase the programmed threshold voltage level, while MLC devices allow the floating-gate to be programmed to any threshold voltage level within a threshold voltage window. The size of the threshold voltage window is limited by the minimum and maximum threshold levels of the device, which in turn correspond to the range of charges that can be programmed onto the floating-gate.

In general, the threshold window depends on the memory device characteristics, operating conditions and history. For example, upon charging a floating-gate, the charges on the floating-gate (e.g., electrons that were injected into the floating-gate by Fowler-Nordheim tunneling) screen (partially cancel) the electric field imposed by the control gate to which a voltage is supplied, and therefore the threshold voltage of the transistor is increased. This means that now a higher voltage must be applied to the control gate to make the channel conductive. In order to read a value from the transistor, an intermediate voltage between the threshold voltage of the uncharged transistor and the increased threshold voltage is applied to the control gate. If the channel conducts at this intermediate voltage, the floating-gate is unchanged, and hence a logical "1" is stored in the gate. If the channel does not conduct at the intermediate voltage, it is indicated that a floating-gate is charged, and hence, a logically "0" is stored on the gate. The presence of the logically "0" or "1" is sensed by determining the conductivity state of the transistor, that is, whether an electric current flows between the source and drain of the transistor at the intermediate voltage.

The memory cells of a flash memory may be typically arranged into a "NOR" architecture, in which each cell is directly coupled to a bit line, or a "NAND" architecture, in which the memory cells are coupled into "strings" of cells, such that each cell within a string is coupled indirectly to a bit line and requires activating the other cells of the string for access.

With the increased popularity of applications like IoT, mobile applications and automatic applications, as well as the continuous demand for higher integration densities and/or higher performance and/or lower power consumption, it is desirable to develop a simple approach for implementing a non-volatile memory cell in standard fabrication flows employing advanced fabrication techniques as known from process flows of fabricating logic devices at advanced technology nodes.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

In a first aspect of the present disclosure, a method of forming a semiconductor device structure is provided. In accordance with some illustrative embodiments herein, the method includes forming a non-volatile memory (NVM) device structure in and above a first region of a semiconductor substrate, the NVM device structure comprising a floating-gate, a first select gate and at least one control gate, and forming a logic device in and above a second region of the semiconductor substrate different from the first region, wherein the logic device comprises a logic gate disposed on the second region and source/drain regions provided in the second region adjacent to the logic gate, wherein the control gate extends over the floating-gate, and wherein the first select gate is laterally separated from the floating-gate by an insulating material layer portion. Upon forming the semiconductor device structure, the floating gate is formed before forming the control gate and the logic device.

In accordance with a second aspect of the present disclosure, a semiconductor device structure is provided. In accordance with some illustrative embodiments herein, the semiconductor device structure includes a non-volatile memory (NVM) device structure formed in and above a first region of a semiconductor substrate, the NVM device structure comprising a floating-gate, a first select gate, a second select gate and at least one control gate, wherein the control gate extends over the floating-gate, wherein the first and second select gates are laterally separated from the floating-gate by respective insulating material layer portions disposed at opposing sides of the floating-gate, and a logic device formed in and above a second region of the semiconductor substrate different from the first region, wherein the logic device comprises a logic gate disposed on the second region and source/drain regions provided in the second region adjacent to the logic gate, wherein the control gate and one of the first and second select gates are integrally formed.

BRIEF DESCRIPTION OF THE DRAWINGS

The disclosure may be understood by reference to the following description taken in conjunction with the accompanying drawings, in which like reference numerals identify like elements, and in which:

FIGS. 3a-3m schematically illustrate, in cross-sectional views, a process of forming a semiconductor device structure in accordance with some illustrative embodiments of the present disclosure.

Figure 1:
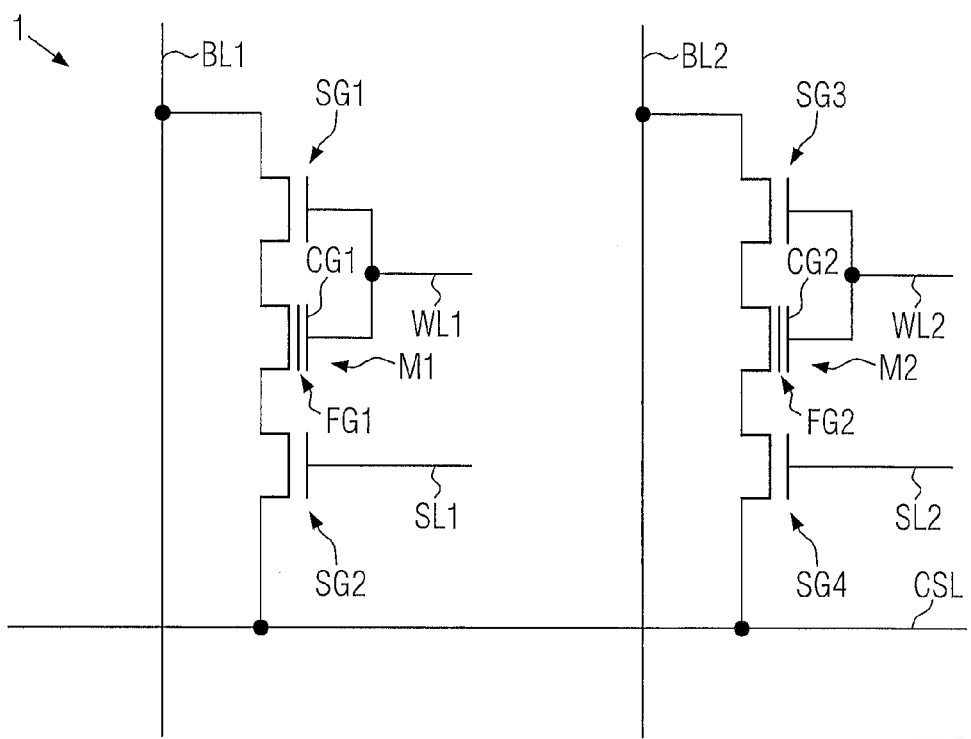
FIG. 1 schematically illustrates a circuit diagram of a non-volatile memory device structure in accordance with some illustrative embodiments of the present disclosure.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase. It is pointed out that any enumeration, such as "a first device/structure/element/component/step/process/layer, etc." does not necessarily indicate any prioritization or order, but may mainly denote an enumeration of devices/structures/elements/components/steps/processes/layers, etc. that are mentioned, stated or described before at least one other device/structure/element/component/step/process/layer, etc. is mentioned, stated or described as "a second device/structure/element/component/step/process/layer, etc." and so on.

In various aspects, the present disclosure relates to a semiconductor device structure, wherein the semiconductor device structure is integrated on or in a chip. In accordance with some illustrative embodiments of the present disclosure, the semiconductor device structure may comprise at least one further semiconductor device, e.g., a transistor structure, a capacitor structure and the like.

Semiconductor device structures of the present disclosure may concern structures which are fabricated by using advanced technologies, i.e., the semiconductor device structures may be fabricated by technologies applied to approach technology nodes smaller than 100 nm, for example, smaller than 50 nm or smaller than 35 nm, e.g., at 22 nm or below. After a complete reading of the present application, a person skilled in the art will appreciate that, according to some illustrative examples described herein, ground rules smaller or equal to 45 nm, e.g., at 22 nm or below, may be imposed. After a complete reading of the present application, a person skilled in the art will appreciate that, in some embodiments, the present disclosure proposes capacitor structures having minimal length dimensions and/or width dimensions smaller than 100 nm, for example, smaller than 50 nm or smaller than 35 nm or smaller than 22 nm. For example, the present disclosure may provide structures fabricated by using 45 nm technologies or below, e.g., 22 nm or even below.

The fabrication of semiconductor devices comprises front-end-of-line (FEOL) processing, wherein semiconductor devices may be formed directly in and on a substrate. Herein, a raw wafer may be engineered by the growth of an ultrapure, virtually defect-free silicon layer through epitaxy, for example. Some methods may comprise introducing a straining step wherein a silicon variant, such as silicon-germanium (SiGe) or silicon carbide (SiC), is deposited, resulting in an improved electronic mobility. Another method, called semiconductor-on-insulator (SOI) technology, e.g., silicon-on-insulator, involves the insertion of an insulating layer between a raw wafer and a thin layer of subsequent semiconductor material, resulting in the creation of transistors with reduced parasitic effects. Front-end surface engineering is followed by forming (e.g., growing) a gate dielectric (e.g., silicon dioxide and/or hafnium oxide), forming a gate electrode material on the gate dielectric, patterning of a gate structure, forming source and drain regions, and subsequently implanting and/or diffusing dopants to implement desired electrical properties. In DRAM devices, storage capacitors may also be fabricated at this time, as will be described below with regard to some illustrative embodiments of the present disclosure.

After FEOL processing is completed, so-called back-end-of-line (BEOL) processing is performed, wherein metal interconnecting wires that are isolated by dielectric layers are formed in plural metallization layers formed over the substrate.

FIG. 1 schematically shows a circuit diagram of a non-volatile memory device structure 1 as provided in accordance with some illustrative embodiments of the present disclosure.

In accordance with some illustrative embodiments of the present disclosure, the non-volatile memory (NVM) device structure may comprise a memory cell M1 of a floating-gate type and a memory cell M2 of a floating-gate type. The memory cell M1 may be coupled to a bit line BL1 at a drain side of the memory cell M1 and the memory cell M2 may be coupled to a bit line BL2 at a drain side of the memory cell M2. This does not pose any limitation to the present disclosure, and the person skilled in the art will appreciate that the bit lines BL1 and BL2 may be two separate bit lines or may be electrically coupled. At the source side of the memory cell M1, the memory cell M1 may be coupled to a source line CSL. Similarly, the memory cell M2 may be coupled to the source line CSL.

In accordance with some illustrative embodiments of the present disclosure, the source line CSL may be a so-called "common source line" to which a plurality of memory cells, that is, at least the memory cells M1 and M2 together with additional memory cells (not illustrated) may be coupled.

In accordance with some illustrative embodiments of the present disclosure, the memory cell M1 may comprise a control gate CG1 formed adjacent to a floating-gate FG1, and the memory cell M2 may comprise a control gate CG2 formed adjacent to a floating-gate FG2.

After a complete reading of the present disclosure, the person skilled in the art will appreciate that the NVM device structure 1 may further comprise additional bit lines (not illustrated) and additional memory cells (not illustrated) similar to the memory cells M1 and M2. Particularly, the circuit arrangement as schematically illustrated in FIG. 1 may be repetitive. In general, the NVM device structure 1 may comprise bit lines BL1 . . . BLn (n is an integer greater than 1, n>1), coupled to memory cells M1 . . . Mn at the drain side of the respective memory cells M1 . . . Mn. At least a subset of the memory cells M1 . . . Mn may be coupled at their source sides to a source line CSL, that is, memory cells M1 . . . Mi may be coupled to the source line CSL, wherein i is an integer satisfying 1<i≤n.

FIG. 1 schematically illustrates one memory cell coupled in between its respective bit line and the source line. This does not pose any limitation on the present disclosure, and the person skilled in the art will appreciate after a complete reading that more than one memory cell may be arranged in series between the bit line and the source line.

Referring to FIG. 1, a select device of a MOSFET type having a select gate SG1 may be coupled between the bit line BL1 and the memory cell M1 at the drain side of the memory cell M1. Furthermore, a select device of a MOSFET type comprising a select gate SG2 may be coupled between the memory cell M1 and the source line CSL at the source side of the memory cell M1.

In accordance with some illustrative embodiments of the present disclosure, as, for example, illustrated in FIG. 1, a select device of a MOSFET type having a select gate SG3 may be coupled between the bit line BL2 and the memory cell M2 at the drain side of the memory cell M2. Furthermore, a select device of a MOSFET type comprising a select gate SG4 may be coupled between the memory cell M2 and the source line CSL at the source side of the memory cell M2.

In accordance with some illustrative embodiments of the present disclosure, the select gate SG1 may be coupled with the control gate CG1 of the memory cell M1. Accordingly, the select gate SG1 and the control gate CG1 may be coupled to a word line WL1. For example, upon supplying a sufficient voltage to the control gate CG1 via the word line WL1, it may be provided that the select device comprising the select gate SG1 is turned "on," that is, the select device may be in the conductive state such that an electric current may flow through the select device having the select gate SG1. The select device comprising the select gate SG2 may be supplied with a voltage by means of a select line SL1 coupled to the select gate SG2. For example, upon supplying a voltage higher than an appropriate threshold voltage to the select gate SG2, the select device comprising the select gate SG2 may be turned "on" and the select device comprising the select gate SG2 may be in the conductive state such that an electric current may flow through the select device. Upon supplying an appropriate voltage to the lines WL1 and SL1, wherein the select devices and, depending on the charged state of the floating-gate FG1, the memory cell M1 may be in the conductive state and an electric current may flow between the source line CSL and the bit line BL1.

In accordance with some illustrative embodiments of the present disclosure, the select gate SG3 may be coupled with the control gate CG2 of the memory cell M1. Accordingly, the select gate SG3 and the control gate CG2 may be coupled to a word line WL2. For example, upon supplying a sufficient voltage to the control gate CG2 via the word line WL2, it may be provided that the select device comprising the select gate SG3 is turned "on," that is, the select device may be in the conductive state such that an electric current may flow through the select device having the select gate SG3. The select device comprising the select gate SG4 may be supplied with a voltage by means of a select line SL2 coupled to the select gate SG4. For example, upon supplying a voltage higher than an appropriate threshold voltage to the select gate SG4, the select device comprising the select gate SG4 may be turned "on" and the select device comprising the select gate SG4 may be in the conductive state such that an electric current may flow through the select device. Upon supplying an appropriate voltage to the lines WL2 and SL2, wherein the select devices and, depending on the charged state of the floating-gate FG2, the memory cell M1 may be in the conductive state and an electric current may flow between the source line CSL and the bit line BL2.

The person skilled in the art will appreciate that the NVM device structure 1 may be part of a NOR or NAND memory architecture integrated with memory cells at high integration density. The NOR and NAND architectures may allow for improved high density memory devices or arrays with integral select gates that can take advantage of the feature sizes that semiconductor fabrication processes are generally capable of and may allow for an appropriate device sizing for operational considerations. Herein, the memory cells may be separated from their associated bit lines and/or source line by means of the respective select devices.

After a complete reading of the present disclosure, the person skilled in the art will appreciate that, in accordance with some illustrative embodiments of the present disclosure representing NAND architectures, more than one memory cell may be formed in between the select devices, the plural memory cells between the select devices forming a "string." In accordance with some illustrative embodiments of the present disclosure showing "NOR" architectures, memory cells may be arranged in a matrix scheme similar to RAM or ROM. The control gates of the memory cells may then be coupled by rows to so-called "word lines" and the drains of the memory cells may be coupled to column bit lines, the source of each memory cell is then typically coupled to a common source line.

In accordance with some illustrative embodiments of the present disclosure showing a NAND architecture, the memory cells within a string may be arranged by 8, 16, 32 or more memory cells, where the memory cells in the string are coupled together in a series, source to drain, between a source line, e.g., a common source line, and a column bit line.

While a NAND architecture may be accessed by a row decoder (not illustrated) activating a row of memory cells by selecting one or more word lines, the word lines coupled to the control gates of unselected memory cells of each string are also driven. However, unselected memory cells of each string are typically driven by a higher gate voltage so as to operate them as path transistors and allowing them to pass an electric current in a manner that is unrestricted by their stored data values. The electric current then flows from the source line to the column bit line through each floating-gate memory cell of the series coupled string, restricted only by the memory cells of each string that are selected to be read. This places the current encoder stored data values of the row of selected memory cells on the column bit lines. A column page of bit lines is selected and sensed, and then individual data words are selected from the sensed data words from the column page and communicated from the memory device.

Regarding NOR architectures, the memory array is accessed by a row decoder (not illustrated) activating a row of memory cells by selecting the word line coupled to the gates of the selected memory cells. The row of selected memory cells then places the stored data values on the column bit lines by flowing a differing current from the coupled source line to the coupled bit lines depending on the programmed states of the selected memory cells. A column page of bit lines is selected and sensed and individual data words are selected from the sensed data words from the column page and communicated from the memory.

Figure 2:
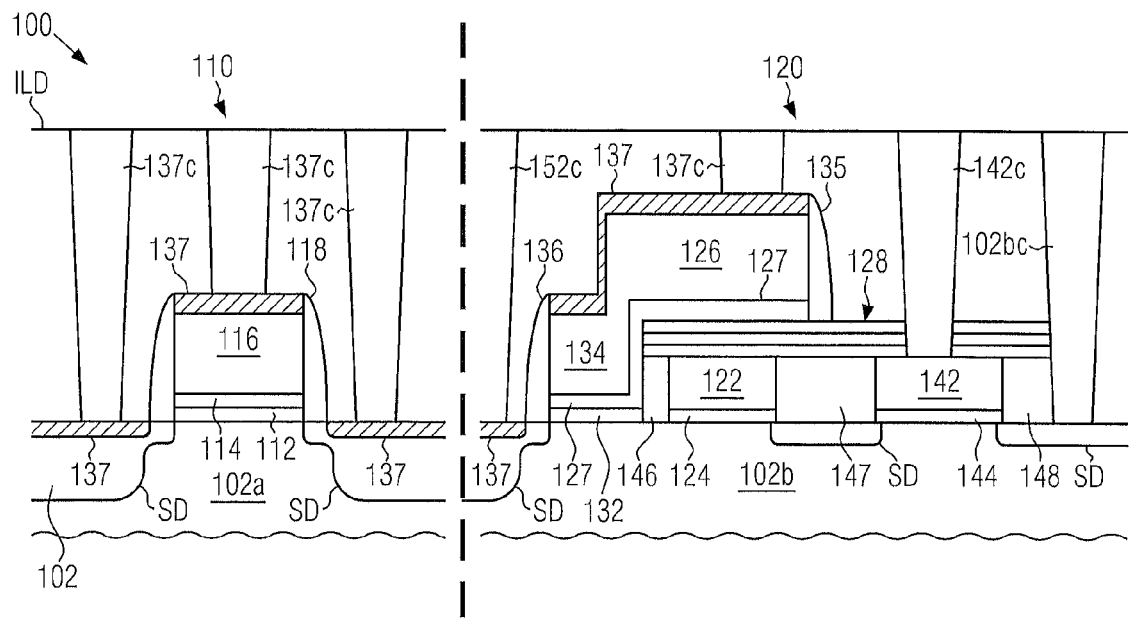
FIG. 2 schematically illustrates, in a cross-sectional view, a semiconductor device structure in accordance with some illustrative embodiments of the present disclosure.

Referring to FIG. 2 at least some illustrative embodiments of the present disclosure will be described. FIG. 2 schematically illustrates, in a cross-sectional view, a semiconductor device structure 100. The semiconductor device structure 100 may comprise a NVM device structure 120 and a logic device 110. The logic device 110 and the NVM device structure 120 may be formed in and above two adjacent surface regions of a semiconductor substrate 102. In accordance with some illustrative examples, at least one intermediate trench isolation structure (not illustrated), e.g., a shallow trench isolation (STI), may be formed between the logic device 110 and the NVM device structure 120. For example, at least one further semiconductor device (not illustrated) and/or at least one further NVM device structure (not illustrated) may be formed in between the logic device 110 and the NVM device structure 120.

The semiconductor device structure 100 in FIG. 2 is schematically illustrated at a stage during or after fabrication, particularly after front-end-of-line (FEoL) processing and middle-end-of-line (MOL) processing is performed, and an interlayer dielectric ILD is deposited over the semiconductor substrate 102 and a pattern of contacts 137c, 142c and 102bc for contacting respective silicide regions 137 via the contacts 137c, for contacting a gate electrode 142 via the contact 142c, and for contacting the semiconductor substrate 102 via the contact 102bc are formed. The contacts 137c, 142c and 102bc extend vertically through the interlayer dielectric ILD. The term "vertically" indicates, in the context of the cross-sectional view depicted in FIG. 2, a direction parallel to a normal of an upper surface of the semiconductor substrate 102.

In accordance with some illustrative embodiments of the present disclosure, the semiconductor substrate 102 may be a semiconductor bulk substrate or may be an active semiconductor layer of a semiconductor-on-isolator (SOI) configuration, wherein, generally, a semiconductor layer, e.g., silicon, silicon germanium and the like, is formed on a buried insulating material layer, e.g., silicon oxide and the like, which in turn is formed on a substrate material, e.g., a semiconductor bulk substrate and the like. In accordance with some illustrative embodiments, wherein the semiconductor substrate 102 is provided in accordance with SOI techniques, the semiconductor substrate 102 may be partially depleted in accordance with partially depleted SOI (PDSOI) techniques or fully depleted in accordance with fully depleted SOI (FDSOI) techniques, as is known in the art. In accordance with some special illustrative embodiments employing PDSOI techniques or using the semiconductor substrate 102 as a bulk substrate, the semiconductor substrate 102 may be doped, e.g., lightly P-doped, and source/drain regions may be implanted into the semiconductor substrate 102 in accordance with known techniques employed at advanced technology nodes using ultra large scale integration (VLSI) processes.

In accordance with some illustrative embodiments of the present disclosure, the logic device 110 may comprise a gate structure comprising a gate electrode 116 formed over a region 102a of the semiconductor substrate 102. The region 102a may be enclosed by trench isolation structures (not illustrated), e.g., STI structures and the like. The gate electrode material 116 may be a known gate electrode material as used in VLSI techniques, e.g., polysilicon, amorphous silicon, an electrode metal and the like. In between the gate electrode material 116 and the region 102a, a gate dielectric 114 comprising a high-k material and/or an oxide material may be formed as known in the art. This does not pose any limitation to the present disclosure, and the person skilled in the art will appreciate that a work function adjusting material (not illustrated), e.g., TiN and the like, may be provided below the gate electrode material 116. Furthermore, an optional channel silicon germanium material cSiGe (material 112) may be formed on the region 102a.

Referring to FIG. 2, the gate electrode material 116 may be covered by a silicide region 137 disposed on the gate electrode material 116 and contacted by the contact 137c, contacting the silicide region 137. Sidewalls of a gate stack formed by the silicide region 137, the gate electrode material 116, the gate dielectric 114 and the (optional) cSiGe material 112 may be covered by a spacer structure 118 laterally enclosing the gate stack and adjusting a spacing between the gate stack and silicide regions 137 formed in the region 102a for contacting source/drain regions S/D formed adjacent to the gate stack at opposing sides of the gate stack. In accordance with some illustrative embodiments of the present disclosure, the spacer structure 118 may be provided by at least a silicon nitride layer and a silicon oxide layer, often referred to as "spacer 0" and "spacer 1", e.g., "spacer 0" may be used for adjusting a spacing between the gate stack and source/drain extension regions and optional hollow regions (not illustrated) used for adjusting the threshold voltage, and "spacer 1" may be used for adjusting a spacing between the gate stack and deep source/drain regions.

In accordance with some illustrative embodiments of the present disclosure, the NVM device structure 120 may comprise a patterned insulating material layer portion indicated by reference numerals 146, 147 and 148 in FIG. 2 denoting insulating material layer portions 146, 147 and 148. The insulating material portion 148 separates the gate electrode 142 from the contact 102bc. The insulating material portion 147 separates the gate electrode 142 and a floating-gate electrode 122. The insulating material portions 146 and 147 laterally enclose the floating-gate electrode 122.

The insulating material layers 146, 147 and 148 may only partially cover an upper surface of a region 102b over which the NVM device structure 120 is formed. On the insulating material layers 146, 147 and 148, as well as the floating-gate electrode 122 and the gate electrode 142, an interpoly dielectric (IPD) 128 may be formed. The IPD 128 may comprise a layer stack of an ONO stack configuration, e.g., comprising a nitride layer formed on an oxide layer, which may be in turn formed on a nitride layer. This does not pose any limitation on the present disclosure, and the person skilled in the art will appreciate that the IPD 128 may be formed by at least one insulating material covering the insulating material layer and the floating-gate electrode 122 and the gate electrode 142 embedded into the insulating material layer. An upper surface of the IPD 128 is partially covered by a control gate electrode 126 which extends over the floating-gate electrode 122, however, which does not cover the gate electrode 142. Accordingly, the control gate electrode 126 and the floating-gate electrode 122 may be comprised of a memory cell, such as one of the memory cells M1 and M2 as described above with regard to FIG. 1. The control gate electrode 126 may be a gate electrode portion of a gate electrode material partially covering an upper surface of the region 102B adjacent to the insulating material layer, i.e., adjacent to the insulating material layer portion 146, and partially overlapping the insulating material layer by means of the control gate electrode 126 and partially extending over the insulating material layer and completely extending over the floating-gate electrode 122. A gate electrode portion 134 of the gate electrode material comprising the control gate electrode 126 and being in contact with the control gate electrode 126 may form the gate electrode material 134 disposed over the region 102b adjacent to the insulating material layer. In alignment with the gate electrode material 134 and spaced apart thereof by means of a spacer structure 136, a silicide region 137 may be formed in the region 102b, the silicide region 137 adjacent to the gate electrode material 134 being contacted by the contact 152c. In accordance with some special illustrative examples, the contact 152c may be coupled to a bit line, e.g., one of the bit lines BL1 and BL2 as described above with regard to FIG. 1. For example, the contact 102bc may be coupled to a source line, e.g., the source line CSL as described above with regard to FIG. 1. The control gate electrode 126 and the gate electrode material 134 may have a silicide region 137 formed thereon and being in contact with the contact 137c. Accordingly, the contact 137c contacting the silicide region 137 over the control gate electrode 126 and the gate electrode material 134 electrically may contact the control gate electrode 126 and the gate electrode material 134. Accordingly, this contact 137c may be coupled to the word line WL1 or the word line WL2 as described above with regard to FIG. 1. The gate electrode material 142 being contacted by the contact 142c may be coupled to the select line SL1 or SL2 as described above with regard to FIG. 1.

In accordance with some illustrative embodiments of the present disclosure, a gate oxide layer 132, e.g., a thick gate oxide layer as employed for high voltage applications (e.g., voltages greater than 1.5 V), may be formed adjacent to the insulating material layer below the gate electrode material 134. A gate dielectric 127, e.g., a high-k dielectric and the like, may be formed below the control gate electrode 126 and the gate electrode material 134. In accordance with some illustrative embodiments of the present disclosure, the gate electrode material 134, the control gate electrode 126, and the gate electrode material 116 may be formed in parallel, that is, may be formed of the same material. In accordance with some illustrative embodiments of the present disclosure, the gate dielectric 127 and the gate dielectric 114 may be formed in parallel, that is, the gate dielectric 127 and the gate dielectric 114 may be formed of the same material.

In accordance with some illustrative embodiments of the present disclosure as depicted in FIG. 2, the control gate electrode 126, the gate dielectric 127, the IPD 128, the floating-gate electrode 122, and the gate oxide 124 provided on the region 102b may correspond to the memory cell M1 or M2 as described above with regard to FIG. 1.

With regard to FIGS. 3a-3m, a process flow of forming a semiconductor device structure in accordance with some illustrative embodiments of the present disclosure will be described in greater detail.

Figure 3A:
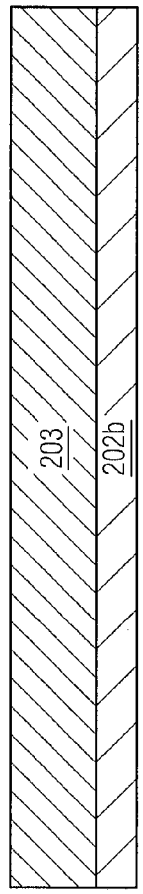

FIG. 3a schematically illustrates a semiconductor device structure 200 at an early stage during fabrication in FEOL processing. Herein, a region 202a and a region 202b of a semiconductor substrate 202 may be provided. The semiconductor 202 may be substantially similar to the semiconductor substrate 102 as described above. Therefore, reference is made to the disclosure provided above with regard to the semiconductor substrate 102, the content of which disclosure is included by reference in its entirety.

In accordance with some illustrative embodiments of the present disclosure, the region 202a and the region 202b may be adjacent regions provided in an upper surface of the semiconductor substrate 202, e.g., separated by means of at least one trench isolation structure (not illustrated), such as at least one STI structure. Furthermore, at least one additional region (not illustrated) in and above which at least one additional semiconductor device is to be formed, may be provided between the regions 202a and 202b.

In accordance with some illustrative embodiments of the present disclosure, an isolation material layer 203 may be formed on the region 202a and on the region 202b. For example, the isolation layer 203 may be formed by an oxide material, e.g., silicon oxide. In accordance with some special illustrative examples herein, the isolation layer 203 may comprise silicon oxide and may be formed by oxidation of the regions 202a and 202b. Alternatively, an oxide material may be deposited by means of TEOS deposition.

Figure 3B:
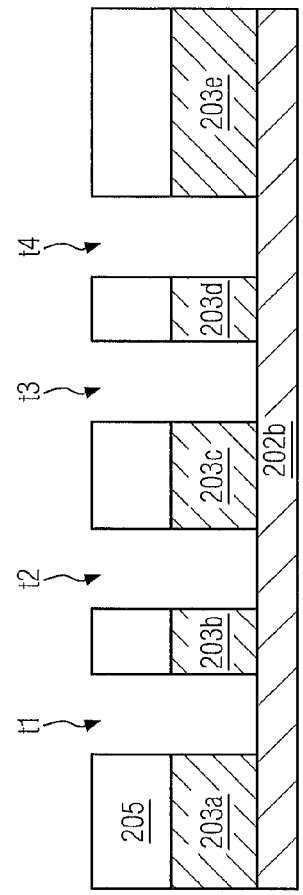

FIG. 3b schematically illustrates the semiconductor device structure 200 at a more advanced stage during fabrication, after a masking pattern 205 is formed over the regions 202a and 202b. The masking pattern may comprise a mask or hard mask pattern in accordance with known photolithographical techniques. In accordance with the masking pattern 205, the isolation layer 203 on the region 202a is completely covered and protected from further processing. Over the region 202b, the masking pattern is formed so as to partially expose the upper surface of the isolation material 203, and an anisotropic etching may be performed in accordance with the masking pattern 205, wherein trenches t1, t2, t3 and t4 may be etched into the isolation layer 203, resulting in a patterned isolation layer having insulating material layer portions 203a, 203b, 203c, 203d and 203e. In accordance with some illustrative embodiments herein, the trenches t1, t2, t3 and t4 may partially expose an upper surface of the region 202b.

Figure 3C:
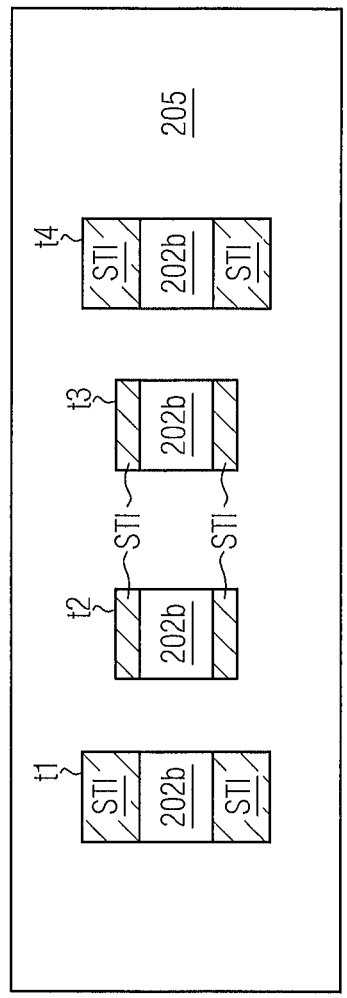

Referring to FIG. 3c, a top view of the semiconductor device structure 200, as schematically illustrated in FIG. 3b, is provided, the top view showing the masking pattern 205 completely overlapping the region 202a, and the masking pattern 205 partially exposing the region 202b by means of the trenches t1, t2, t3 and t4. Due to a patterning process of the semiconductor substrate 202 preceding the stage as illustrated in FIG. 3a and resulting in the regions 202a and 202b, the region 202b may be laterally enclosed by a trench isolation structure STI, as indicated in FIG. 3c. Accordingly, an appropriately dimensioned region 202b may be patterned prior to the stage as illustrated in FIG. 3a. In accordance with some special illustrative examples herein, the region 202b may be patterned, for example, as a fin-shaped structure projecting from the semiconductor substrate 202 in FIG. 1 and being surrounded by the STI as schematically illustrated in FIG. 3c. This does not pose any limitation to the present disclosure, and the person skilled in the art will appreciate that the region 202b may have any shape in a top view, such as a general quadrangular shape.

Figure 3D:
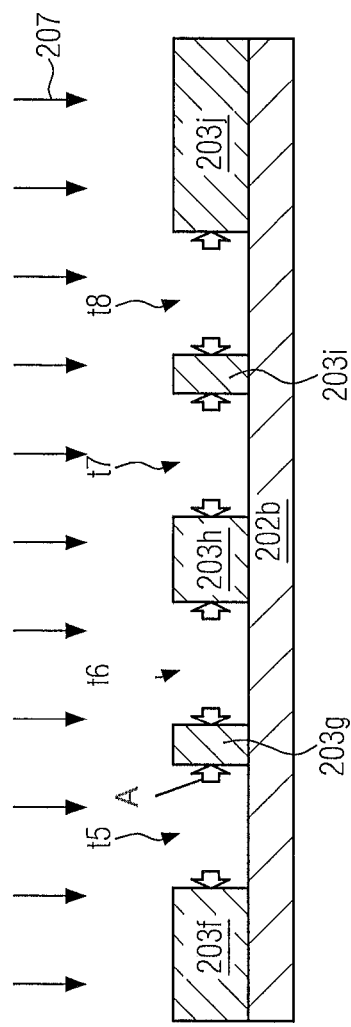

FIG. 3d schematically illustrates the semiconductor device structure 200 at a more advanced stage during fabrication, after the masking pattern 205, as illustrated in FIGS. 3b and 3c, is removed and the insulating material layer 203 is exposed over the region 202a and the insulating material layer portions 203a to 203e, as schematically illustrated in FIG. 3b, are exposed. At the stage as schematically illustrated in FIG. 3d, an etching process 207 may be performed in order to shape the insulating material layer 203, particularly, the insulating material layer portions 202a to 202e as illustrated in FIG. 3b. As a result of the etching process 207, the insulating material layer portions are at least laterally shaped as indicated by arrows A in FIG. 3d, wherein shaped insulating material layer portions 203f, 203g, 203h, 203i and 203j having at least a smaller dimension according to the shaping indicated by the arrows A in FIG. 3d when compared to the insulating material layer portions 203a to 203d depicted in FIG. 3b. Accordingly, trenches t5, t6, t7 and t8 may be formed, the trench t5 having a width greater than the trench t1. Accordingly, the trenches t6, t7 and t8 may have a greater width than the respective trenches t2, t3 and t4.

In accordance with some illustrative embodiments of the present disclosure, the etching process 207 may comprise an anisotropic etching process, e.g., a wet etch process using HF in case of the insulating material layer 203 being formed by an oxide material. After a complete reading of the present disclosure, the person skilled in the art will appreciate that the etching process 207 is, in accordance with some special illustrative examples, selective relative to the region 202b such that any modification of the region 202b is avoided or at least minimized. For example, a thickness of the insulating material layer 203 may be decreased due to the etching process 207 over the regions 202a and 202b. Accordingly, a decrease of the thickness of the insulating material layer 203 caused by the etching process 207 may be taken into account when forming the insulating material layer 203, that is, a thickness of the insulating material layer 203 in FIG. 3a may be appropriately chosen, taken the effects of the etching process 207 into account, such that the insulating material layer 203 having a desired thickness is present after the etching process 207 is completed.

Although the present disclosure is described with regard to FIG. 3d including the etching process 207, this does not pose any limitation to the present disclosure and the person skilled in the art will appreciate that the etching process 207 may be omitted. However, performing the etching process 207 for increasing a lateral width of the trenches may have the advantageous effect that an injection efficiency of gate electrodes to be formed within the trenches as described below may be improved.

After a complete reading of the present disclosure, the person skilled in the art will appreciate that, by means of the etching process 207, the trenches t1 to t4 may be shaped or trimmed by shaping the insulating material layer portions 203a to 203e depicted in FIG. 3b by means of the shaping process 207, resulting in the trenches t5 to t8 caused by the shaped insulating material layer portions 203f to 203j depicted in FIG. 3d.

FIG. 3e schematically illustrates the semiconductor device structure 200 at a more advanced stage during fabrication, after a gate dielectric 224 is formed within the trenches t5 to t8 in FIG. 3d and a gate electrode material 211 may be blanket deposited over the regions 202a and 202b. Accordingly, the trenches t5 to t8 depicted in FIG. 3d are overfilled by the gate electrode material 211.

In accordance with some illustrative embodiments of the present disclosure, the gate dielectric 224 may be an oxide material formed by performing an oxidation after the etching process 207 depicted in FIG. 3d is completed and prior to the deposition of the gate electrode material 211. Due to the oxidation, the partially exposed surfaces of the region 202b within the trenches t5 to t8 in FIG. 3d are subjected to oxidation and oxide material is formed within the trenches t5 to t8, forming the gate dielectric 224 within the trenches t5 to t8. The region 202a is not exposed to the oxidation due to the insulating material layer 203.

After the gate electrode material 211 is deposited, a planarization process 213 may be performed, e.g., a chemical mechanical polishing (CMP) process, using the insulating material layer 203 as an end point for the planarization process 213. That is, the planarization process 213 may terminate when exposing the insulating material layer 203 and the insulating material layer portions 203f to 203j.

FIG. 3f schematically illustrates the semiconductor device structure 200 at a more advanced stage during fabrication, after the planarization process 213 is completed and an inter poly dielectric (IPD) 228 is formed over the regions 202a and 202b. The IPD 228 may be formed over the insulating material layer 203 over the region 202a and the IPD 228 may be formed over the insulating material layer portions 203f to 203j and gate electrodes 222 provided in between the insulating material layer portions 203f to 203j. Referring to FIG. 3f, the IPD 228 extends over the gate electrode materials 222.

In accordance with some illustrative embodiments of the present disclosure, the IPD 228 may comprise a layer stack formed by a layer 228a disposed on a layer 228b which may be in turn disposed on a layer 228c. In accordance with some special illustrative examples herein, the layers 228a, 228b and 228c may implement an ONO configuration comprising a nitride layer, e.g., 228b, interposed between two oxide layers 228a and 228c. This does not pose any limitation to the present disclosure and the person skilled in the art will appreciate that at least one layer of an insulating material may be used as IPD 228.

FIG. 3g schematically illustrates the semiconductor device structure 200 at a more advanced stage during fabrication, after a mask 215 is formed, the mask 215 partially covering an upper surface of the IPD 228 such that the mask 215 may be disposed over the gate electrode materials 222. The person skilled in the art will appreciate that the IPD 228 and the insulating material layer 203 disposed over the region 202a may be exposed to further processing.

Referring to FIG. 3g, and anisotropic etching process 217 may be subsequently performed (i.e., after forming the mask 215), wherein the anisotropic etching process 217 may remove the IPD 228 and the insulating material layer 203 in alignment with the mask 215. In accordance with some illustrative examples herein, the etching process 217 may comprise a sequence of etch steps for sequentially etching the IPD 228 and the insulating material layer 203.

FIG. 3h schematically illustrates the semiconductor device structure 200 at a more advanced stage during fabrication, after the etching process 217 is completed and the region 202a is exposed to further processing. Furthermore, after having removed the mask 215 over the region 202b, the IPD 228 may be patterned in accordance with the mask 215 over the region 202b. Accordingly, the IPD 228 overlaying the gate electrode materials 222 which may be laterally enclosed by the insulating material layer portions remain over the region 202b in accordance with a pattern defined by the mask 215. Due to the pattern of the mask 215, the etching process 217 depicted in FIG. 3g exposes upper surface regions US1 and US2 of the region 202b adjacent to the patterned IPD 228 and the insulating material layer portions.

In accordance with some illustrative embodiments of the present disclosure, the region 202a may be completely exposed to further processing and the region 202b may be partially exposed to further processing via the exposed upper surface regions US1 and US2 of the region 202b.

FIG. 3i schematically illustrates the semiconductor device structure 200 at a more advanced stage during fabrication, after at least one of a silicon germanium layer and a gate oxide may be formed on the exposed upper surfaces of the region 202a and the region 202b, the newly formed material being indicated by reference numeral 219 in FIG. 3i.

In accordance with some special illustrative examples herein, a deposited silicon germanium material may be removed from above the region 202b and an oxide material may be formed on exposed upper surfaces of the region 202b.

FIG. 3j schematically illustrates the semiconductor device structure 200 at a more advanced stage during fabrication, after a gate stack 221 comprising a gate electrode material 216 disposed on a gate dielectric 214 (optionally including a work function adjusting material, e.g., TiN; not illustrated) and an optional cSiGe layer or oxide liner 212. The gate stack 221 may be formed by depositing a stack of layers over the region 202a and appropriately patterning the deposited layers over the region 202a.

In accordance with some illustrative embodiments of the present disclosure, gate stacks 221a and 221b may be formed over the region 202b, the gate stacks 221a and 221b partially covering an upper surface of the IPD 228, as well as partially extending over the region 202b laterally adjacent to the IPD 228.

In accordance with some illustrative embodiments of the present disclosure, the gate stack 221a may comprise a gate electrode portion 226 disposed on the IPD 228 and extending over the gate electrode 222 intended as a floating-gate electrode 222. The gate electrode portion 226 may not extend over a gate electrode material 242 adjacent to the floating-gate electrode 222 and may be separated therefrom by means of the insulating material layer portion 203g. The gate electrode portion 226 may be in communication with a gate electrode portion 234 disposed over region 202b laterally adjacent to the floating-gate electrode 222 and the IPD 228. Similarly, the gate stack 221b may comprise a gate electrode portion 256 and a gate electrode portion 258, the gate electrode portion 256 extending over a floating-gate electrode 272, while not extending over an adjacent gate electrode 262 separated from the floating-gate electrode 272 by means of the insulating material layer portion 203i. That is, the gate electrode portions 226 and 256 may partially extend over the respective insulating material layer portions 203g and 203i.

After a complete reading of the present disclosure, the person skilled in the art will appreciate that the gate electrode portions 226 and 256 may act as control gates formed over the floating-gate electrodes 222 and 272.

The gate electrode portions 234 and 258 are formed over respective gate oxide layers 232 and 252. The gate oxides 232 and 252 may be provided as thick oxide material layers configured to support high voltage levels, e.g., voltages above 5 volts, supplied to the gate electrode portions 234 and 258.

Referring to the process as schematically illustrated in FIGS. 3g-3j, the IPD layer 228 may be patterned over the region 202b (see FIGS. 3g and 3h), the patterned IPD covering the floating-gate electrodes 222 and 272 (see FIG. 3j). Therefore, the process as schematically illustrated in FIG. 3g, the result of which is schematically illustrated in FIG. 3h, may be considered as exposing the upper surface regions US1 and US2 of the region 202b adjacent to the floating-gate electrodes 222 and 272 such that the gate electrode portions 234 and 258 may be formed over the upper surface regions US1 and US2 of the region 202b indicated in FIG. 3h.

In accordance with some illustrative embodiments of the present disclosure, the gate stacks 221, 221a and 221b may be obtained by successively depositing at least one gate dielectric material layer and a gate electrode material layer over the regions 202a and 202b (this deposition process is not illustrated in the figures), and patterning the deposited material layers over the regions 202a and 202b (the patterning is not illustrated in the figures).

Figure 3K:
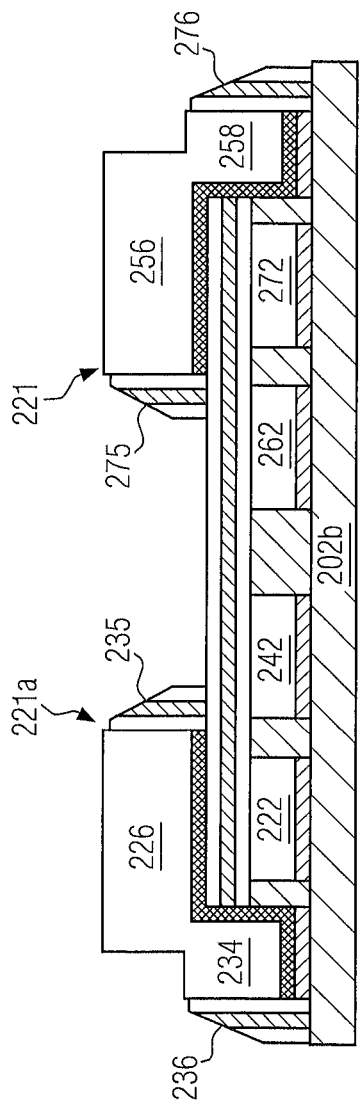

FIG. 3k schematically illustrates the semiconductor device structure 200 at a more advanced stage during fabrication, after spacer structures 218, 235, 236, 275 and 276 are formed adjacent to the gate stacks 221, 221a and 221b. The spacer structures 218, 235, 236, 275 and 276 may be formed in accordance with known spacer forming techniques, such as depositing spacer material and anisotropically etching the spacer material.

In accordance with some illustrative embodiments of the present disclosure, the spacer structures may be formed by three spacer layers, e.g., a combination of oxide and nitride material layers. Each of the spacer structures 218, 235, 236, 275 and 276 may cover sidewalls of the respective gate stacks 221, 221a and 221b.

Figure 3L:
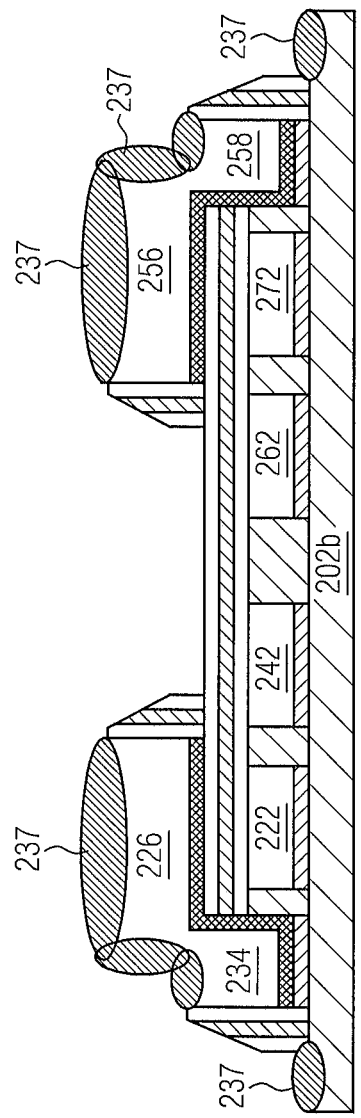

Subsequent to the spacer structure formation, optional implants for forming source/drain regions may be performed, and known salicidation (self-aligned silicidation) processes may be performed, resulting in the semiconductor device structure 200 as schematically illustrated in FIG. 3l, wherein silicide regions 237 are formed on exposed upper surfaces of semiconductor materials, that is, exposed upper surfaces of the regions 202a and 202b, as well as exposed upper surfaces of the gate electrodes 216, 226, 234, 256 and 258. In accordance with some special illustrative examples herein, the silicide regions 237 may be formed by nickel silicide.

Figure 3M:
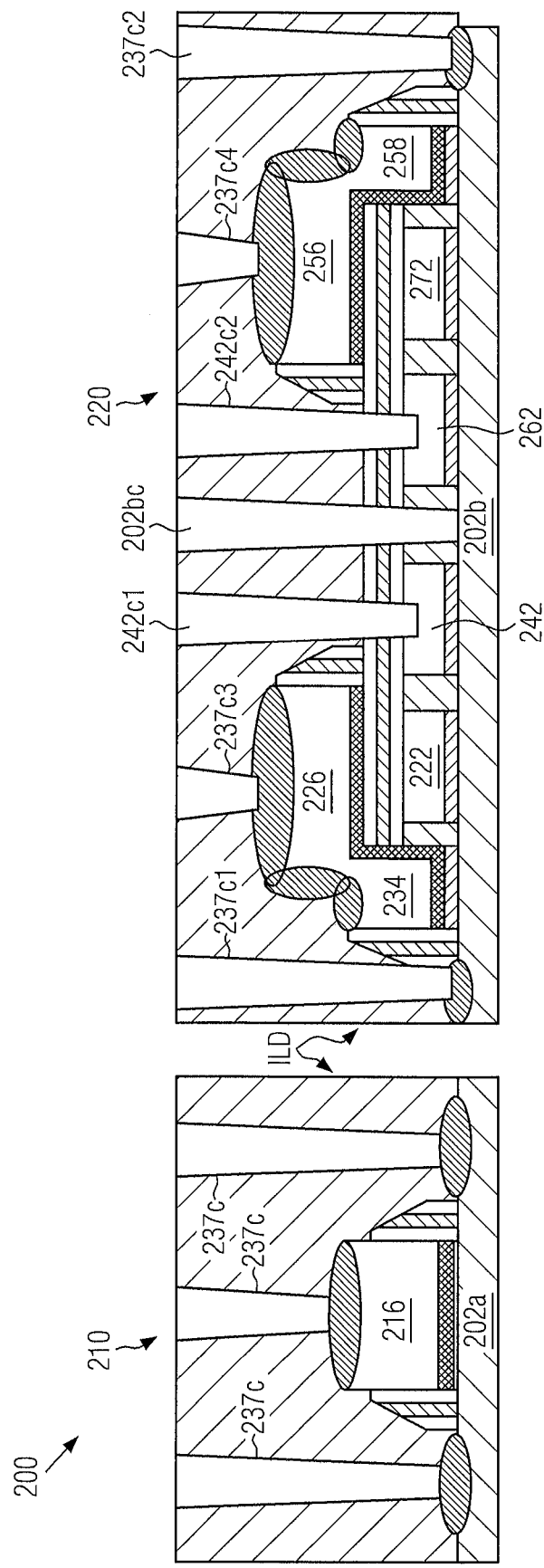

FIG. 3m schematically illustrates the semiconductor device structure 200 at a more advanced stage during fabrication, after FEOL processing may be completed and MEOL process steps for forming an interlayer dielectric ILD (optionally with a nitride stressor liner, not illustrated) and contacts 237c, 237c1, 237c3, 202bc, 242c2, 237c4 and 237c2 may be formed. Accordingly, a semiconductor device 210, e.g., a logic device having contacts 237c contacting the silicide regions 237 in and above the region 202a are formed. Furthermore, a NVM device structure 220 may be formed in and above the region 202b, wherein a select gate electrode 234 is provided, having a drain side contact 237c1. The select gate electrode 234 may be electrically coupled with a control gate electrode 226, the control gate electrode 226 being contacted with the contact 237c3. A select gate electrode 242 may be contacted via the contact 242c1, the source side of the select gate electrode 242 being contacted by the contact 202bc which may be coupled to a source line as described above with regard to CSL in FIG. 1. Furthermore, a select gate electrode 258 may be provided, the select gate electrode being adjacent to a drain side contact 237c2. The select gate electrode 258 may be electrically coupled with a control gate electrode 256, the control gate electrode 256 being contacted with the contact 237c4. A select gate electrode 262 may be contacted via the contact 242c2, the source side of the select gate electrode 262 being contacted by the contact 202bc which may be coupled to a source line as described above with regard to CSL in FIG. 1.

After a complete reading of the present disclosure, the person skilled in the art will appreciate that the semiconductor device structure 200 may, at least in some illustrated embodiments of the present disclosure, correspond to the semiconductor device 100 as described above with regard to FIG. 2.

In accordance with some illustrative embodiments of the present disclosure, the gate dielectrics 224, 244, 264, 274, as schematically illustrated in FIG. 3j and which are fabricated in accordance with the gate dielectric 224 in accordance with the description to FIG. 3e, may have a thickness in a range from about 5-15 nm, e.g., at about 9 nm.

In accordance with some illustrative embodiments of the present disclosure, the gate dielectric 232 as schematically illustrated in FIG. 3j may have a thickness of greater than 15 nm.

After a complete reading of the present disclosure, the person skilled in the art will appreciate that the presented illustrative embodiments as described above with regard to FIGS. 3a-3m provide a simple approach to implement a non-volatile memory cell in a standard logic flow without increasing the number of process steps to an unacceptable degree. In order to minimize the number of additional process steps as described above with regard to FIGS. 3a-3m, the floating-gate electrode(s) and select device(s) may be processed in one sequence, prior to the formation of logic devices.

In accordance with the above description, e.g., the discussion of FIG. 3d above, the distance between the split and floating-gates may be minimized to maximize the program efficiency of the floating-gate. Accordingly, power consumption of the NVM device structure may be reduced.

In accordance with some illustrative embodiments of the present disclosure, the semiconductor device structure and, particularly, the NVM device structure as disclosed above, may be employed in applications such as SoC (system on a chip), IoT (internet of things), mobile applications and automotive applications.

As the source side select device is processed together with the floating-gate, the process complexity may be minimized as opposed to conventional techniques.

In accordance with some special illustrative examples herein, a semiconductor device comprising a NVM device structure is disclosed, the NVM device structure being inserted in a standard process flow of fabricating logic devices prior to the formation of the logic device, therefore not being influenced by the temperature budget of the fabrication of logic devices. In a first step, an isolation material layer may be formed and patterned with structures that are intended to form select and memory devices at a later stage. In the patterned structures, a gate dielectric, e.g., gate oxide, may be formed and covered by an electrode material, e.g., polysilicon. The deposited electrode material may then be polished to form and separate gate electrodes. The remaining structure is covered by an IPD layer, e.g., an ONO layer. The IPD layer and insulating material layer may then be removed adjacent to the previously patterned structures and, subsequently, logic gate(s) may be patterned. At this stage, an HV gate dielectric, e.g., a high voltage (HV) gate oxide, may be formed adjacent to the patterned structure for support devices exposed to high voltage inputs. The formation of the HV gate dielectric may be performed after the patterning of the insulating material layer. The control gate electrode may extend over edges of the patterned structures, wherein the support devices may be formed. After having formed the logic devices, the standard logic process flow may be continued as known in the art.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modi-fled and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required.

Accordingly, the protection sought herein is as set forth in the claims below.

What is claimed:

1. A method of forming a semiconductor device structure, the method comprising:
   forming a non-volatile memory (NVM) device structure in and above a first region of a semiconductor substrate, said NVM device structure comprising a floating gate, a first select gate, and at least one control gate, wherein said control gate extends over said floating gate, and wherein said first select gate is laterally separated from said floating gate by an insulating material layer portion, said first select gate and said control gate comprising first and second gate electrode portions of a contiguous and integral gate electrode material; and
   forming a logic device in and above a second region of said semiconductor substrate different from said first region, wherein said logic device comprises a logic gate disposed on said second region and source/drain regions provided in said second region adjacent said logic gate;
   wherein said floating gate is formed before forming said control gate and said logic device.

2. The method of claim 1, wherein said forming said NVM device structure comprises forming an inter poly dielectric (IPD) over said floating gate prior to forming said control gate.

3. The method of claim 2, wherein forming said IPD comprises forming said IPD over said first and second regions, and removing said IPD over said second region.

4. The method of claim 3, further comprising patterning said IPD over said first region, wherein said patterned IPD covers said floating gate and said select gate.

5. The method of claim 2, wherein forming said IPD comprises depositing a layer stack comprising an oxide material and a nitride material, said nitride material being embedded into said oxide material.

6. The method of claim 2, further comprising:
   exposing an upper surface portion of said first region adjacent said floating gate after said IPD is formed; and
   subsequently forming said control gate over said first region and said logic gate over said second region in parallel.

7. The method of claim 6, wherein forming said control gate and said logic gate comprises successively depositing at least one gate dielectric material layer and a gate electrode material layer over said first and second regions, and patterning said deposited material layers over said first and second regions.

8. The method of claim 7, wherein said patterned deposited material layers over said second region comprise a first portion of patterned material layers extending over said floating gate and a second portion of patterned material layers extending over said exposed upper surface portion, said first portion implementing said control gate and said second portion implementing a second select gate.

9. The method of claim 8, further comprising forming a contact structure contacting said control gate, wherein said contact structure simultaneously contacts said second select gate.

10. The method of claim 1, wherein forming said NVM device structure comprises forming a second select gate laterally adjacent to said floating gate, a further insulating material layer portion separating said second select gate from said floating gate, wherein said control gate does not extend over said second select gate.

11. A method of forming a semiconductor device structure, the method comprising:
    forming a non-volatile memory (NVM) device structure in and above a first region of a semiconductor substrate, said NVM device structure comprising a first floating gate, a first select gate, and a first control gate, wherein said first control gate extends over said first floating gate and said first select gate is laterally separated from said first floating gate by an insulating material layer portion, said first floating gate being formed before said first control gate, wherein forming said NVM device structure comprises:
      forming an insulating material layer over said first region and over a second region of said semiconductor substrate that is different from said first region;
      patterning said insulating material layer over said first region, wherein patterning said insulating material layer comprises etching first and second trenches into said insulating material layer; and
      forming a layer stack comprising a gate dielectric material and a polysilicon material within each of said trenches, said first floating gate and said first select gate being formed in said respective first and second trenches;
    after forming said first floating gate, forming a logic device in and above said second region, wherein said logic device comprises a logic gate disposed on said second region and source/drain regions provided in said second region adjacent said logic gate.

12. The method of claim 11, wherein patterning said insulating material layer over said first region further comprises:
    etching at least third and fourth trenches into said insulating material layer;
    forming said layer stack comprising said gate dielectric material and said polysilicon material within each of said at least said third and fourth trenches, wherein a second floating gate and a second select gate are formed in said respective third and fourth trenches; and
    forming a second control gate over said first region, said second control gate extending over said second floating gate.

13. The method of claim 12, further comprising forming an inter poly dielectric (IPD) over said first and second floating gates prior to forming said first and second control gates.

14. The method of claim 13, wherein forming said IPD comprises forming said IPD over said first and second regions, and removing said IPD over said second region.

15. The method of claim 14, further comprising patterning said IPD over said first region, wherein said patterned IPD covers said first and second floating gates and said first and second select gates.

16. The method of claim 13, further comprising:
    exposing a first upper surface portion of said first region adjacent said first floating gate and exposing a second upper surface portion of said first region adjacent said second floating gate prior to said forming of said IPD; and subsequently forming said first and second control gates over said first region and said logic gate over said second region in parallel.

17. The method of claim 16, wherein forming said first and second control gates and said logic gate comprises successively depositing at least one gate dielectric material layer and a gate electrode material layer over said first and second regions, and patterning said deposited material layers over said first and second regions.

18. A semiconductor device structure, comprising:

a non-volatile memory (NVM) device structure formed in and above a first region of a semiconductor substrate, said NVM device structure comprising a floating gate, a first select gate, a second select gate and at least one control gate, wherein said control gate extends over said floating gate but not over said first select gate, wherein said first and second select gates are laterally separated from said floating gate by respective insulating material layer portions disposed at opposing sides of said floating gate, and wherein said control gate and said second select gate comprise first and second gate electrode portions of a contiguous and integral gate electrode material; and a logic device formed in and above a second region of said semiconductor substrate different from said first region, wherein said logic device comprises a logic gate disposed on said second region and source/drain regions provided in said second region adjacent to said logic gate.

19. The semiconductor device structure of claim 18, wherein said control gate and said floating gate are separated by an inter poly dielectric positioned therebetween.

20. The semiconductor device structure of claim 19, wherein said inter poly dielectric extends over said floating gate and said first select gate but not over said second select gate.

* * * * *